United States Patent
Fukunaga et al.

(10) Patent No.: US 10,361,298 B2
(45) Date of Patent: Jul. 23, 2019

(54) SEMICONDUCTOR DEVICE HAVING IMPROVED TRENCH AND ELECTRODE STRUCTURES

(71) Applicant: SANKEN ELECTRIC CO., LTD., Niiza-Shi, Saitama (JP)

(72) Inventors: Shunsuke Fukunaga, Saitama (JP); Taro Kondo, Niiza (JP); Shinji Kudoh, Hiki (JP)

(73) Assignee: SANKEN ELECTRIC CO., LTD., Niiza-Shi (JP)

( * ) Notice: Subject to any disclaimer, the term of this patent is extended or adjusted under 35 U.S.C. 154(b) by 0 days.

(21) Appl. No.: 15/822,408

(22) Filed: Nov. 27, 2017

(65) Prior Publication Data

US 2019/0165158 A1    May 30, 2019

(51) Int. Cl.
| | |
|---|---|
| *H01L 29/66* | (2006.01) |
| *H01L 29/423* | (2006.01) |
| *H01L 29/78* | (2006.01) |
| *H01L 29/417* | (2006.01) |
| *H01L 29/10* | (2006.01) |
| *H01L 29/36* | (2006.01) |
| *H01L 21/02* | (2006.01) |
| *H01L 29/167* | (2006.01) |
| *H01L 21/265* | (2006.01) |
| *H01L 21/324* | (2006.01) |
| *H01L 21/3065* | (2006.01) |

(Continued)

(52) U.S. Cl.
CPC ...... *H01L 29/7811* (2013.01); *H01L 29/1079* (2013.01); *H01L 29/1095* (2013.01); *H01L 29/36* (2013.01); *H01L 29/41766* (2013.01); *H01L 29/41775* (2013.01); *H01L 29/4236* (2013.01); *H01L 29/66727* (2013.01); *H01L 29/66734* (2013.01); *H01L 29/7813* (2013.01); *H01L 21/02164* (2013.01); *H01L 21/02238* (2013.01); *H01L 21/26513* (2013.01); *H01L 21/28035* (2013.01); *H01L 21/3065* (2013.01); *H01L 21/3081* (2013.01); *H01L 21/324* (2013.01); *H01L 29/167* (2013.01)

(58) Field of Classification Search
CPC ......... H01L 29/66734; H01L 29/66727; H01L 29/4236

See application file for complete search history.

(56) References Cited

U.S. PATENT DOCUMENTS

| | | | | |
|---|---|---|---|---|
| 5,998,833 | A * | 12/1999 | Baliga | H01L 21/823487 257/329 |
| 9,263,552 | B2 * | 2/2016 | Vellei | H01L 29/66666 |

(Continued)

*Primary Examiner* — Nduka E Ojeh
(74) *Attorney, Agent, or Firm* — Metrolexis Law Group, PLLC

(57) ABSTRACT

A semiconductor device may comprise a substrate; a trench formed in the substrate and filled with an insulating layer; and a gate electrode and a source embedded in the insulating layer. The gate electrode and the source electrode may be positioned in the insulating layer in the trench above and below each other. From a cross-sectional perspective, the gate electrode and the source electrode are not overlapped in horizontal or vertical direction. The trench may extend to a first depth of a bottom surface of the trench below the gate electrode, and may extend to a second depth of the bottom surface of the trench below the source electrode. The first depth and the second depth may be different.

10 Claims, 14 Drawing Sheets

(51) Int. Cl.
   *H01L 21/308* (2006.01)
   *H01L 21/28* (2006.01)

(56) References Cited

U.S. PATENT DOCUMENTS

| | | | |
|---|---|---|---|
| 2003/0001202 A1* | 1/2003 | Kitamura | H01L 29/0653 257/330 |
| 2007/0138547 A1* | 6/2007 | Nakamura | H01L 29/66719 257/331 |
| 2012/0025304 A1* | 2/2012 | Blank | H01L 29/407 257/331 |
| 2012/0061753 A1* | 3/2012 | Nishiwaki | H01L 29/407 257/331 |
| 2012/0241761 A1* | 9/2012 | Asahara | H01L 29/407 257/77 |
| 2015/0380534 A1* | 12/2015 | Rahimo | H01L 29/7455 257/140 |

* cited by examiner

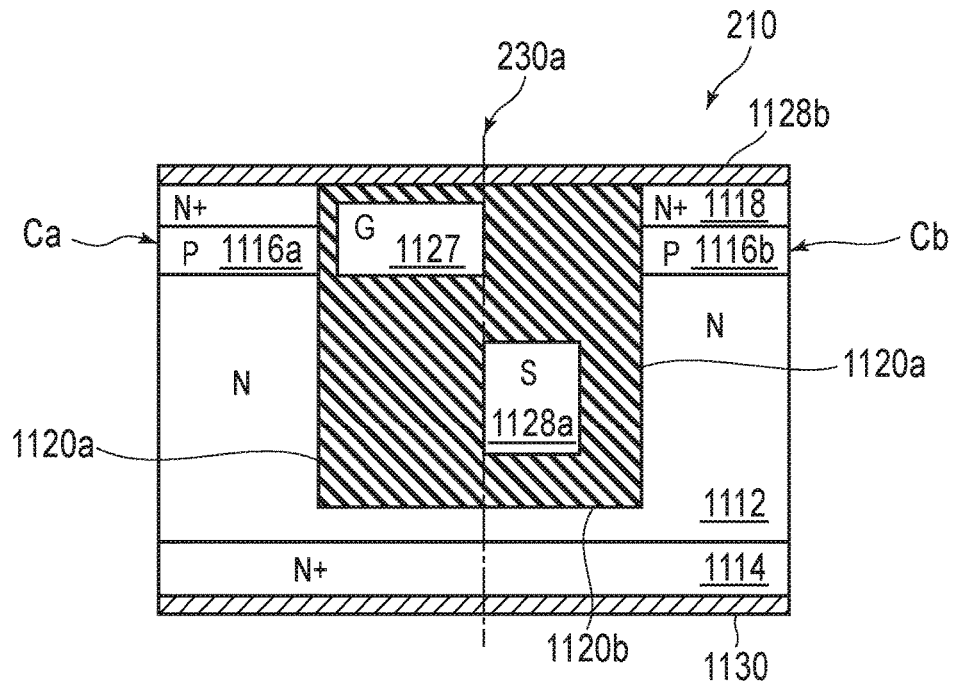
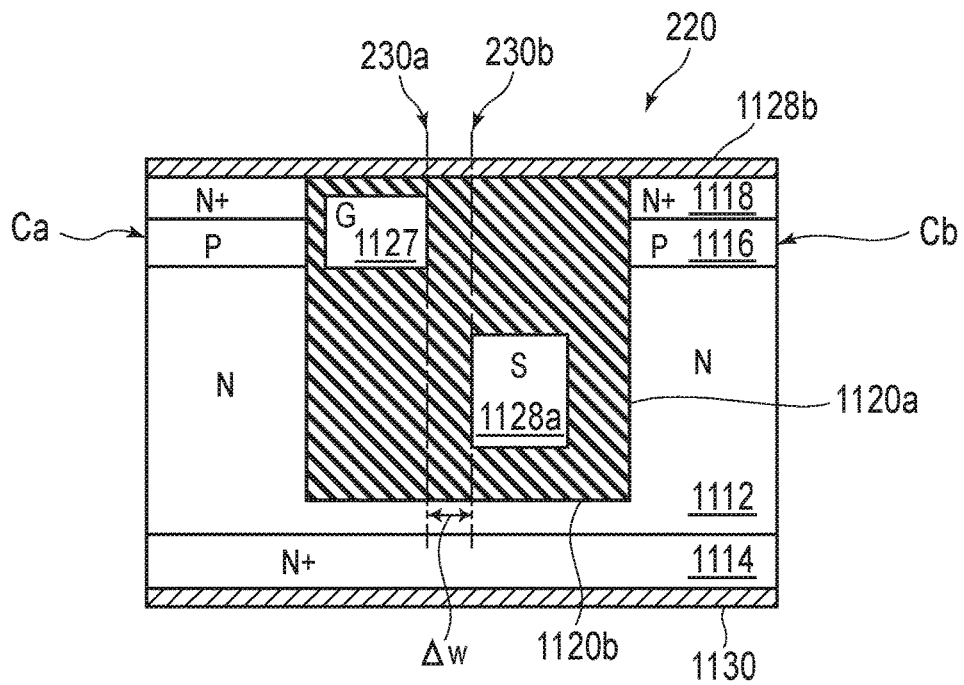

US 10,361,298 B2

SEMICONDUCTOR DEVICE HAVING IMPROVED TRENCH AND ELECTRODE STRUCTURES

BACKGROUND

1. Field of the Invention

The present disclosure is generally related to a semiconductor device, and specifically to a semiconductor device having an improved trench and electrode structures.

2. Description of Related Art

A trench structure in which a gate electrode is embedded in a trench may be adopted for a semiconductor device, including a power semiconductor device such as a vertical MOSFET or related composite or hybrid device. Examples of trench structures having edge termination and breakdown characteristics (for example, see U.S. Pat. No. 5,998,833 ("Patent Literature 1")).

However, devices may still suffer from limitations. For example, gate electrodes and source electrodes may be positioned overlapping each other respectively on the upside and/or downside. Further, the alignment of the electrodes may vary. Disadvantageously, the overlapping and the variance in the positioning of the electrodes leads to unstable characteristics in the resulting manufactured semiconductor devices. Therefore, there is a need for improvements in the alignment of the electrodes to improve manufacturing yield and performance characteristics of devices.

SUMMARY

A semiconductor device according to one or more embodiments includes: a substrate; a trench formed in the substrate and filled with an insulating layer; and a gate electrode and a source embedded in the insulating layer. The gate electrode and the source electrode may be positioned in the insulating layer in the trench above and below each other. From a cross-sectional perspective, the gate electrode and the source electrode are not overlapped in horizontal or vertical direction.

Further in one or more embodiments, the trench may extend to a first depth of a bottom surface of the trench below the gate electrode and a second depth of the bottom surface of the trench below the source electrode. In some embodiments, the first depth and the second depth are different. In some embodiments, the second depth is deeper than the first depth. The source electrode comprises an upper surface that faces a trench opening, and is positioned deeper in the trench than the first depth of the bottom surface of the trench below the gate electrode.

Further in one or more embodiments, a base layer of the substrate adjacent a first sidewall of the trench on a first side of the gate electrode comprises a first concentration of a first conductivity type. The base layer of the substrate adjacent a second sidewall of the trench on a second side of the date electrode comprises a second concentration of the first conductivity type. The first concentration is a higher concentration than the second concentration. The first concentration and the second concentration are related by the expression: $Ca/Cb>2$, wherein $Ca$ is the first concentration, and $Cb$ is the second concentration. The source electrode comprises an upper surface that faces a trench opening, positioned deeper in the trench than the first depth of the bottom surface of the trench below the gate electrode.

The trench comprises a first trench and a second trench different from the first trench. The gate electrode is formed in the first trench and the source electrode is formed in the second trench, and a bottom surface of the second trench below the source electrode is deeper than a bottom surface of the first trench below the gate electrode. A first material of an insulating layer of the first trench is different from a second material of an insulating layer of second trench. In some embodiments, the first material comprises $SiO_2$ and the second material comprises $Si_3N_4$.

Those skilled in the art will recognize additional features and advantages upon reading the following detailed description, and upon viewing the accompanying drawings.

BRIEF DESCRIPTION OF DRAWINGS

The accompanying drawings, which are incorporated herein and constitute part of this specification, illustrate exemplary embodiments of the invention, and together with the general description given above and the detailed description given below, serve to explain the features of the invention.

FIG. 2A is a diagram illustrating a cross-sectional view of a trench configuration of a power semiconductor device having an improved relationship of a gate electrode and a source electrode according to one or more embodiments;

FIG. 2B is a diagram illustrating a cross-sectional view of a trench configuration of a power semiconductor device having an improved offset relationship of a gate electrode and a source electrode according to one or more embodiments;

DETAILED DESCRIPTION

Figure 1:
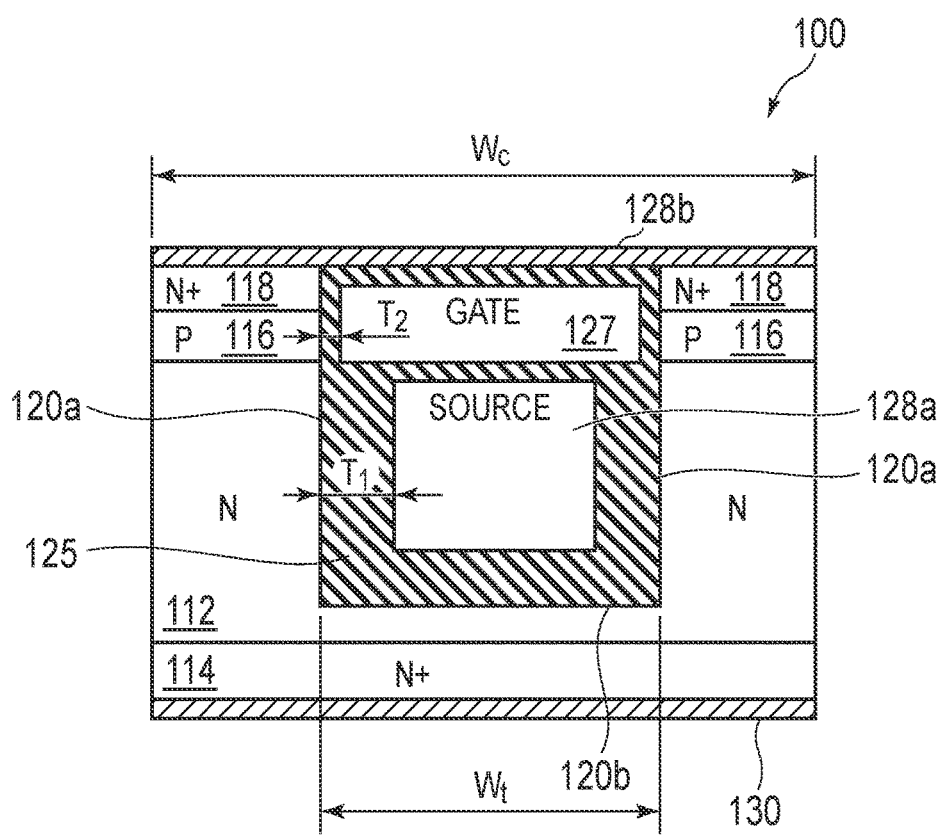
FIG. 1 is a diagram illustrating a cross-sectional view of a trench configuration of a power semiconductor device having a gate electrode and a source electrode according to a background example.

Embodiments are described with reference to drawings, in which the same constituents are designated by the same reference numerals and duplicate explanation concerning the same constituents may be omitted for brevity and ease of explanation. The drawings are illustrative and exemplary in nature and provided to facilitate understanding of the illustrated embodiments and may not be exhaustive or limiting. Dimensions or proportions in the drawings are not intended to impose restrictions on the disclosed embodiments. For this reason, specific dimensions and the like should be interpreted with the accompanying descriptions taken into consideration. In addition, the drawings include parts whose dimensional relationship and ratios are different from one drawing to another.

Prepositions, such as "on", "over" and "above" may be defined with respect to a surface, for example a layer surface, regardless of the orientation of the surface in space.

A power semiconductor device structure of the background art, such as that disclosed in Patent Literature 1, the contents of which are incorporated herein by reference is illustrated in FIG. 1. The integrated power semiconductor device may include a unit cell 100 having a predetermined width "Wc" (e.g., 1 μm) and may comprise a highly doped drain layer 114 of first conductivity type (e.g., N+), a drift layer 112 of first conductivity type, which may include a linearly graded doping concentration therein, a relatively thin base layer 116 of second conductivity type (e.g., P-type) and a highly doped source layer 118 of the first conductivity type (e.g., N+). A source electrode 128b and drain electrode 130 may also be provided at the first and second faces, in ohmic contact with the source layer 118 and drain layer 114, respectively. The source electrode 128b also preferably forms an ohmic contact with the base layer 116 in a third dimension (not shown). In some examples, the drift layer 112 may be formed by epitaxially growing an N-type in-situ doped monocrystalline silicon layer.

In some examples, the drift layer 112 may have a given thickness, e.g. about 4 μm, on an N-type drain layer 114 (e.g., N+ substrate) having a thickness, e.g. about 100 μm, and a first conductivity type doping concentration of greater than about $1\times10^{18}$ cm$^{-3}$ (e.g., $1\times10^{19}$ cm$^{-3}$). The drift layer 112 may have a linearly graded doping concentration with a maximum concentration of greater than about $5\times10^{16}$ cm$^{-3}$ (e.g., $3\times10^{17}$ cm$^{-3}$ at the N+/N non-rectifying junction with the drain layer 114 and a minimum concentration of $1\times10^{16}$ cm$^{-3}$ at a depth of 1 μm and continuing at a uniform level to the upper face. The base layer 116 may be formed by implanting P-type dopants, such as boron, into the drift layer 112 at an energy of 100 k eV and at a dose level of, for example, $1\times10^{14}$ cm$^2$. The P-type dopants may be diffused to a depth of 0.5 μm into the drift layer 112. An N-type dopant such as arsenic may then be implanted at an energy of 50 k eV and at dose level of $1\times10^{15}$ cm$^{-2}$.

The N-type and P-type dopants may be diffused simultaneously to a depth of 0.5 μm and 1.0 μm, respectively, to form a composite semiconductor substrate containing the drain, drift, base and source layers. The first conductivity type (e.g., N-type) doping concentration in the drift layer 112 may be less than about $5\times10^{16}$ cm$^{-3}$ at the P-N junction with the base layer 116 (i.e., second P-N junction), and may be only about $1\times10^{16}$ cm$^{-3}$ at the P-N junction with the base layer 116. The second conductivity type (e.g., P-type) doping concentration in the base layer 116 is also preferably greater than about $5\times10^{16}$ cm$^{-3}$ at the P-N junction with the source layer 118 (i.e., first P-N junction). Furthermore, the second conductivity type doping concentration in the base layer 116 at the first P-N junction (e.g., $1\times10^{17}$ cm$^{-3}$) is about ten times greater than the first conductivity type doping concentration in the drift region at the second P-N junction (e.g., $1\times10^{16}$ cm$^{-3}$).

In disclosed embodiments, a trench having a pair of opposing sidewalls 120a extending in a third dimension (not shown) and a bottom 120b may be formed in the substrate. For the unit cell 100 having a width We of 1 μm, the trench is preferably formed to have a width "Wt" of 0.5 μm at the end of processing. A gate electrode/source electrode insulating region 125, a gate electrode 127 (e.g., polysilicon) and a trench-based source electrode 128a (e.g., polysilicon) are also formed in the trench. Because, in background embodiments, the gate electrode 127 may be made relatively small and does not occupy the entire trench, the amount of gate charge required to drive the unit cell 200 during switching is relatively small. However, inter alia, the size, and positioning of the gate electrode 127 and of the source electrode 128b and the relative positions of the gate electrode 127 and the source electrode 128b within the trench may be set to achieve desired operational characteristics as will be described in greater detail hereinafter.

The trench-based source electrode 128a may be electrically connected to the source electrode 128b in a third dimension (not shown). The portion of the gate electrode/source electrode insulating region 125 extending around at least portions of the source electrode 128a adjacent the trench sidewalls 120a, the trench bottom 120b and the drift layer 112 may also have a thickness "T1" in a range between about 1500 Å and 3000 Å, for example, to inhibit the occurrence of high electric field crowding at the bottom corners of the trench and to provide a substantially uniform potential gradient along the trench sidewalls 120a. However, the portion of the gate electrode/source electrode insulating region 125 extending around side portions of the gate electrode 127 opposite the portions of the trench sidewalls 120a adjacent to the base layer 116 and the source layer 118 preferably has a thickness "T2" of less than about 750 Å, and more preferably about 500 Å to maintain the threshold voltage of the device at about 2-3 volts. As will be described hereinafter, the thicknesses T1 and T2 may be changed along with position of the electrodes, penetration depth and shape of the trench wall In the illustrated embodiments, the specific on-resistance of the unit cell 100 may be relatively high. Moreover, the specific the high frequency figure-of-merit (HFOM), defined as $(R_{on, sp}(Q_{GS}+Q_{GD}))-1$, where $Q_{GS}$ and $Q_{GD}$ represent the gate-source and gate-drain charge per unit area may be acceptable.

However, in accordance with one or more embodiments as will be described hereinafter, the operational characteristics of a power semiconductor device may be improved. Specifically, trench structures may be provided that reliably penetrate into the substrate at a given depth and according to a given width and other shape related parameters and a gate electrode and source electrode may be embedded in the insulated film in a given alignment, e.g. such that the gate and source electrode do not overlap. In further embodiments, the trench may be stepped and/or overlapped to accommodate the positioning of the gate and source electrodes.

First Embodiment

FIG. 2A and FIG. 2B illustrate a cross-sectional view of a power semiconductor device having unit cells 210 and 220 in accordance with at least a first embodiment. Except as described in connection with disclosed and illustrated embodiments, the description of FIGS. 2A and 2B may be applicable to the subsequent figures and embodiments where the description would be redundant. The unit cells 210 and 220 may comprise a highly doped drain layer 1114 of first conductivity type (e.g., N+), a drift layer 1112 of first conductivity type, which may include a linearly graded doping concentration therein, a relatively thin base layer 1116 of second conductivity type (e.g., P-type) and a highly doped source layer 1118 of the first conductivity type (e.g., N+). A source electrode 1128b and drain electrode 1130 may also be provided at the first and second faces, in ohmic contact with the source layer 1118 and drain layer 1114, respectively. The source electrode 1128b also preferably forms an ohmic contact with the base layer 1116 in a third dimension (not shown). In some examples, the drift layer 1112 may be formed by epitaxially growing an N-type in-situ doped monocrystalline silicon layer. A base layer 1116a of the substrate adjacent a first one of the sidewalls 1120a of the trench on a first side of the gate electrode 1127 includes a first concentration Ca of the second conductivity type, and a base layer 1116b of the substrate adjacent a second one of the sidewalls 1120a of the trench on a second side of the gate electrode includes a second concentration Cb of the second conductivity type. In some examples, the first concentration Ca is a higher concentration than the second concentration Cb. More specifically, the first concentration Ca and the second concentration Cb may be related by the expression: Ca/Cb>2.

In some examples, the drift layer 1112 may have a given thickness, e.g. about 4 μm, on an N-type drain layer 1114 (e.g., N+ substrate) having a thickness, e.g. 100 μm, and a first conductivity type doping concentration of greater than about $1\times10^{18}$ cm$^{-3}$ (e.g., $1\times10^{19}$ cm$^{-3}$). The drift layer 1112 may have a linearly graded doping concentration with a maximum concentration of greater than about $5\times10^{16}$ cm$^{-3}$ (e.g., $3\times10^{17}$ cm$^{-3}$) at the N+/N non-rectifying junction with the drain layer 1114 and a minimum concentration of $1\times10^{16}$ cm$^{-3}$ at a depth of 1 μm and continuing at a uniform level to the upper face. The base layer 1116 may be formed by implanting P-type dopants, such as boron, into the drift layer 1112 at an energy of 100 k eV and at a dose level of, for example, $1\times10^{14}$ cm$^2$. The P-type dopants may be diffused to a depth of 0.5 μm into the drift layer 1112. An N-type dopant such as arsenic may then be implanted at an energy of 50 k eV and at dose level of $1\times10^{15}$ cm$^{-2}$.

The N-type and P-type dopants may be diffused simultaneously to a depth of 0.5 μm and 1.0 μm, respectively, to form a composite semiconductor substrate containing the drain, drift, base and source layers. The first conductivity type (e.g., N-type) doping concentration in the drift layer 1112 may be less than about $5\times10^{16}$ cm$^{-3}$ at the P-N junction with the base layer 1116 (i.e., second P-N junction), and may be only about $1\times10^{16}$ cm$^{-3}$ at the P-N junction with the base layer 1116. The second conductivity type (e.g., P-type) doping concentration in the base layer 1116 is also preferably greater than about $5\times10^{16}$ cm$^{-3}$ at the P-N junction with the source layer 1118 (i.e., first P-N junction). Furthermore, the second conductivity type doping concentration in the base layer 1116 at the first P-N junction (e.g., $1\times10^{17}$ cm$^{-3}$) is about ten times greater than the first conductivity type doping concentration in the drift region at the second P-N junction (e.g., $1\times10^{16}$ cm$^{-3}$).

Unlike unit cell 100, in accordance with one or more embodiments, a trench having a pair of opposing sidewalls 1120a extending in a third dimension (not shown) and a bottom 1120b may be formed in the substrate to a greater penetration depth to facilitate the production of desirable characteristics. The trench may be formed to penetrate the substrate to a given depth at bottom 1120, which is deeper than background examples. Moreover, the source electrode 1128a and the gate electrode 1127 may be arranged above/below each other such that at least from a cross sectional perspective, the source electrode 1128a and the gate electrode 1127 do not overlap in the horizontal or vertical direction. For example, with reference to FIG. 2A, a first side of the gate electrode 1127 may be positioned closer to the trench sidewall 1120a and a second side of the gate electrode 1127 may be positioned adjacent to an alignment line 230a. A first side of the source electrode 1128a is also adjacent to the trench sidewall 1120a such that the source electrode does not overlap the gate electrode 1127 along a horizontal axis, e.g. by crossing the alignment line 230a. It will be understood that the source electrode 1128a is also located below the gate electrode 1127 such that there is also no overlap between the source electrode 1128a and the gate electrode 1127 along a vertical axis.

As illustrated in FIG. 2B, the second side of the gate electrode 1127 may be adjacent to the alignment line 230a and the first side of the source electrode may be adjacent to an alignment line 230b, which is spaced apart by a width Δw from the alignment line 230a to establish a lateral offset between the gate electrode 1127 and the source electrode 1128a. In the example illustrated in FIG. 2B, the source electrode 1128a is also located below the gate electrode 1127 such that there is also no overlap between the source electrode 1128a and the gate electrode 1127 along a vertical axis.

Second Embodiment

Figure 3A:
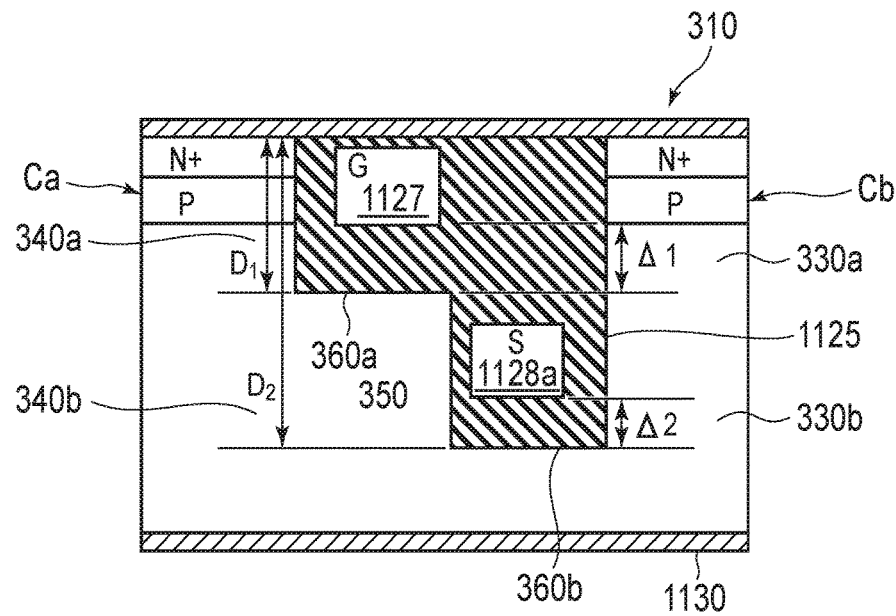
FIG. 3A is a diagram illustrating a cross-sectional view of a trench configuration of a power semiconductor device having an improved trench shape, and an improved offset relationship of a gate electrode and a source electrode according to one or more alternative or additional embodiments.
Figure 3B:
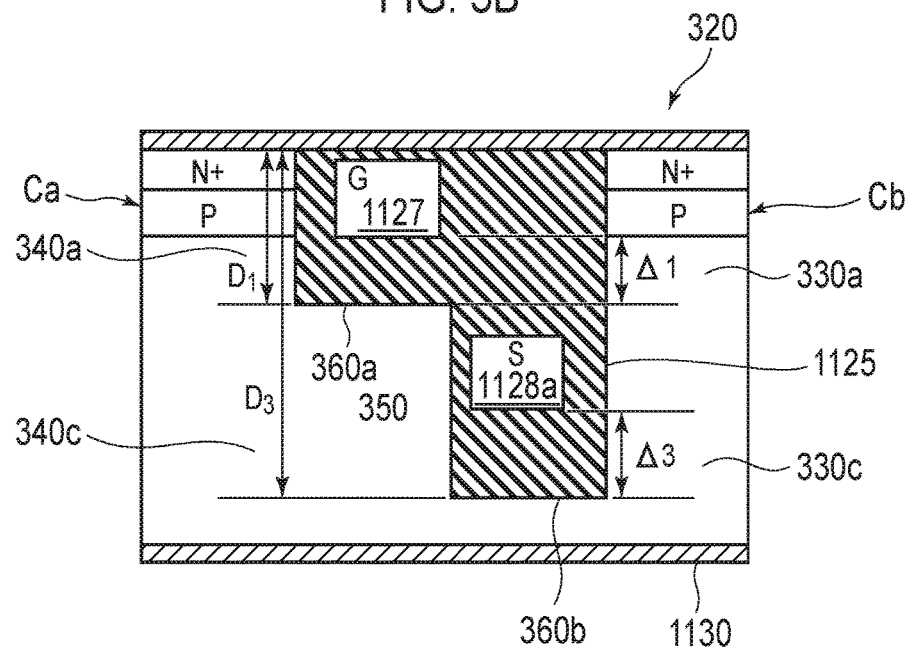
FIG. 3B is a diagram illustrating a cross-sectional view of a trench configuration of a power semiconductor device having an improved trench shape and depth, and an improved offset relationship of a gate electrode and a source electrode according to one or more alternative or additional embodiments.

FIG. 3A and FIG. 3B illustrate a cross-sectional view of a power semiconductor device having unit cells 310 and 320 in accordance with at least a second embodiment. FIG. 3A and FIG. 3B will be described with reference to the unit cells 210 and 220 of FIG. 2A and FIG. 2B such that duplicate descriptions of elements previously described in connection with FIG. 2A and FIG. 2B will be omitted for simplicity. A second embodiment may differ from a first embodiment in that a step area 350 is formed in the trench. A first trench bottom 360a of the step area 350 of the trench may have a depth $D_1$ 340a below the trench opening at an upper surface of the substrate. The depth $D_1$ 340a maybe be set and/or the positioning of the gate electrode 1127 may be set such that the first trench bottom 360a of the step area 350 of the trench is located below the bottom surface of the gate electrode 1127 by a distance Δ1 330a. A second trench bottom 360b of the trench may have a depth $D_2$ 340b below the trench opening at an upper surface of the substrate. The depth $D_2$ 340b maybe be set and/or the positioning of the source electrode 1128b may be set such that the second trench bottom 360b the trench is located below the bottom surface of the source electrode 1128a by a distance Δ2 330b.

In some embodiments, as is illustrated in FIG. 3B, the second trench bottom 360b of the trench may have a deeper depth $D_3$ 340c below the trench opening at an upper surface of the substrate. The depth $D_3$ 340c maybe be set and/or the positioning of the source electrode 1128b may be set such that the second trench bottom 360b the trench is located below the bottom surface of the source electrode 1128a by a distance Δ3 330c.

Third Embodiment

Figure 4A:
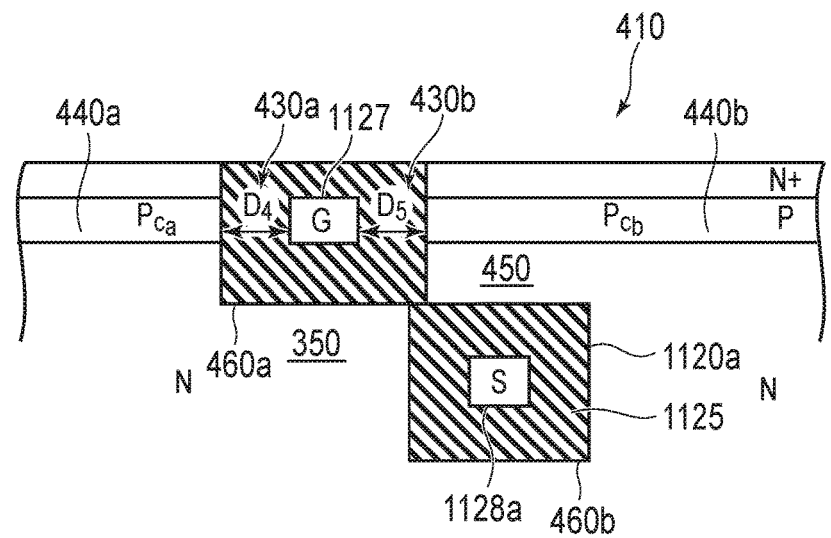
FIG. 4A is a diagram illustrating a cross-sectional view of a trench configuration of a power semiconductor device having an improved offset trench shape, and an improved positioning of a gate electrode and a source electrode according to one or more alternative or additional embodiments.
Figure 4B:
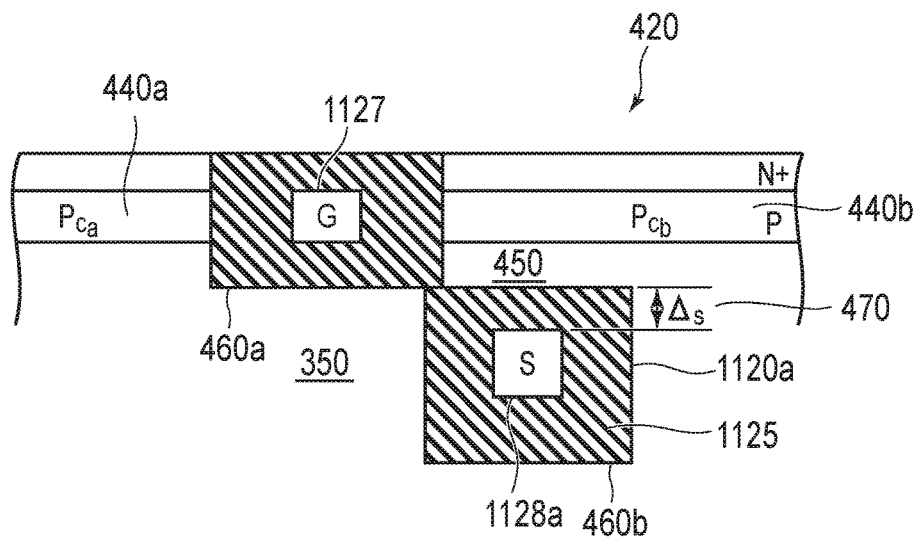
FIG. 4B is a diagram further illustrating a cross-sectional view of a trench configuration of a power semiconductor device having an improved offset trench shape, and an improved positioning of a gate electrode and a source electrode according to one or more alternative or additional embodiments.

FIG. 4A and FIG. 4B illustrate a cross-sectional view of a power semiconductor device having unit cells 410 and 420 in accordance with at least a third embodiment. FIG. 4A and FIG. 4B will be described with reference to the unit cells 210 and 220 of FIG. 2A and FIG. 2B and unit cells 310 and 320 of FIG. 3A and FIG. 3B such that duplicate descriptions of elements previously described in connection with FIG. 2A, FIG. 2B, FIG. 3A and FIG. 3B will be omitted for simplicity. A third embodiment may differ from a second embodiment and a first embodiment in that the step area 350 and an overhang area 450 are formed in the trench and the concentration of adjacent areas adjacent to the trench sidewalls may be set.

As illustrated in FIG. 4A, the first side of the gate electrode 1127 may be positioned a distance $D_4$ 430a from a first portion 440a of the substrate adjacent to the trench sidewall 1120a. The first portion 440a may be of a first conductivity type (e.g. a P-type) having a concentration $P_{Ca}$. The second side of the gate electrode 1127 may be positioned a distance $D_5$ 430b from a second portion 440b of the substrate adjacent to the portion of the overhang portion 450 forming the trench sidewall 1120a. The second portion 440b may be of a first conductivity type (e.g. a P-type) having a concentration $P_{Cb}$.

In one or more embodiments, $D_4$ 430a and $D_5$ 430b may be related according to the expression: $D_4 > D_5$. Moreover, the concentration $P_{Ca}$ of the first portion 440a may be higher than the concentration $P_{Cb}$ of the second portion 440b. In some embodiments, as is illustrated in FIG. 4B, a top surface of the source electrode 1128a may be spaced from a lower surface of the overhang portion 450 by a spacing distance Δs 470. The trench in which the gate electrode 1127 is held extends to depth 460a. The trench in which the source electrode 1128a is held extends to depth 460b.

Fourth Embodiment

Figure 5A:
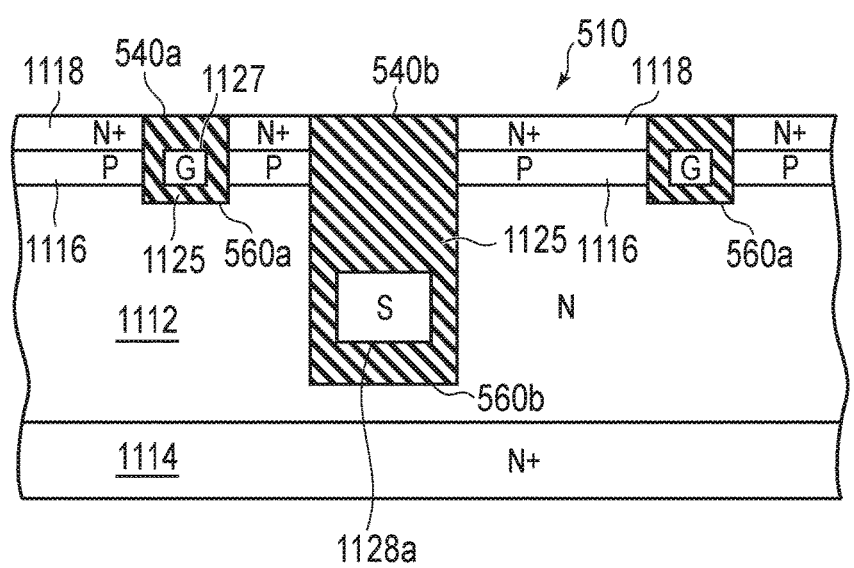
FIG. 5A is a diagram illustrating a cross-sectional view of a trench configuration of a power semiconductor device having improved modified isolated trench structures for a gate electrode and a source electrode according to one or more alternative or additional embodiments.
Figure 5B:
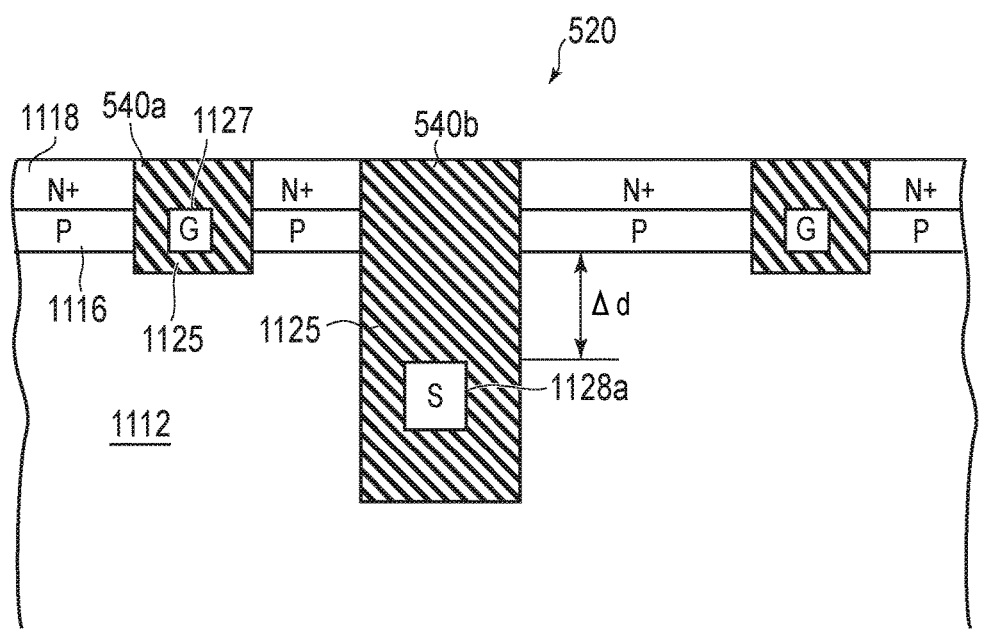
FIG. 5B is a diagram further illustrating a cross-sectional view of a trench configuration of a power semiconductor device having improved modified isolated trench structures for a gate electrode and a source electrode including source electrode depth positioning according to one or more alternative or additional embodiments.
Figure 5C:
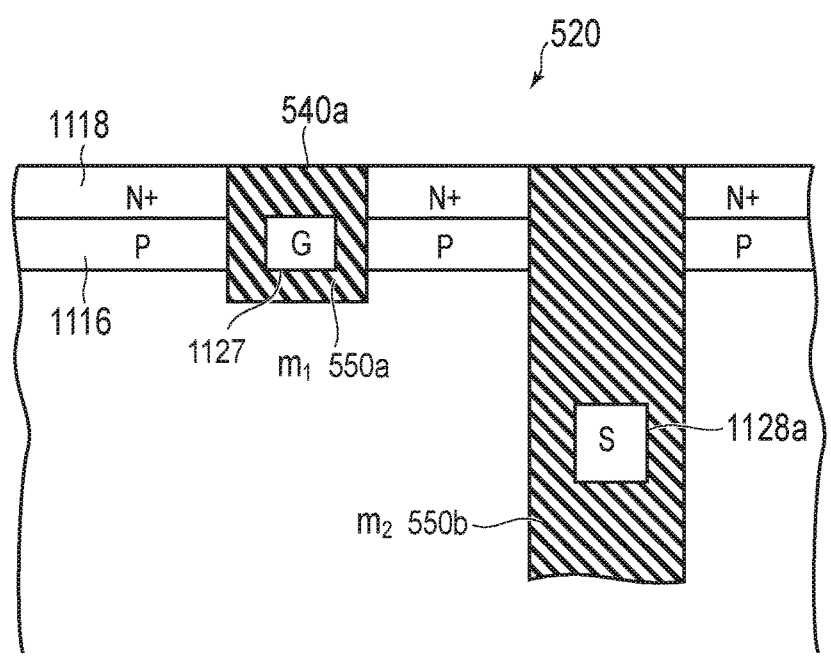
FIG. 5C is a diagram further illustrating a cross-sectional view of a trench configuration of a power semiconductor device having improved modified isolated trench structures for a gate electrode and a source electrode including electrode insulation materials according to one or more alternative or additional embodiments.

FIG. 5A, 5B and FIG. 5C illustrate a cross-sectional view of a power semiconductor device having unit cells 510, 520 and 530 in accordance with at least a fourth embodiment. FIG. 5A, FIG. 5B and FIG. 5C will be described with reference to the unit cells 210 and 220 of FIG. 2A and FIG. 2B, unit cells 310 and 320 of FIG. 3A and FIG. 3B and unit cells 410 and 420 of FIG. 4A and FIG. 4B such that duplicate descriptions of elements previously described in connection with FIG. 2A, FIG. 2B, FIG. 3A, FIG. 3B, FIG. 4A and FIG. 4B will be omitted for simplicity. A fourth embodiment may differ from a third embodiment, a second embodiment and a first embodiment in that a first trench 540a and a second trench 540b may be formed in the substrate. The first trench 540a may be filled with the electrode insulating material 1125 in which the gate electrode 1127 is embedded. The second trench 540b may be filled with the electrode insulating material 1125 in which the source electrode 1128a is embedded.

As illustrated in FIG. 5B in connection with the unit cell 520, the source electrode 1128a may be positioned within the insulating material 1125 within the second trench 540b at a distance Δd.

As illustrated in FIG. 5C in connection with the unit cell 530, the first trench 540a may be configured to hold the gate electrode 1127 by embedding the gate electrode 1127 in a first material m1 550a. The second trench 540b may be configured to hold the source electrode 1128a by embedding the source electrode 1128a in a second material m2 550b different from the first material. In some embodiments, the first material m1 550a may be silicon dioxide ($SiO_2$) and the second material 550b may be silicon nitride ($Si_3N_4$).

Fifth Embodiment

In a fifth embodiment, a process for forming the structures in the above described embodiments is disclosed. In accordance with FIG. 6A-FIG. 6C, diagrams illustrating cross-sectional views of a substrate of a power semiconductor device during various stages of formation and suitable for forming improved trench and electrode structures according to one or more embodiments are described. In accordance with FIG. 7A-FIG. 7G, diagrams illustrating cross-sectional views of a substrate of a power semiconductor device during various stages of trench and gate electrode structure formation according to one or more embodiments are described. In accordance with FIG. 8A-FIG. 8J, diagrams further illustrating cross-sectional views of a substrate of a power semiconductor device during various stages of trench and electrode structure formation according to one or more embodiments are described.

Figure 6A:
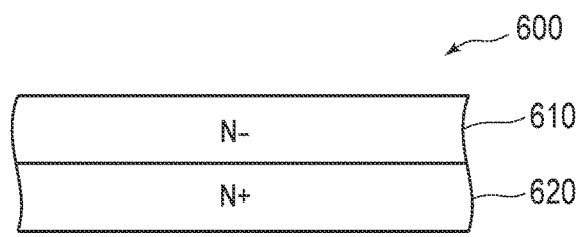
FIG. 6A-FIG. 6C are diagrams illustrating cross-sectional views of a substrate of a power semiconductor device during various stages of formation and suitable for forming improved trench and electrode structures according to one or more embodiments.
Figure 6B:
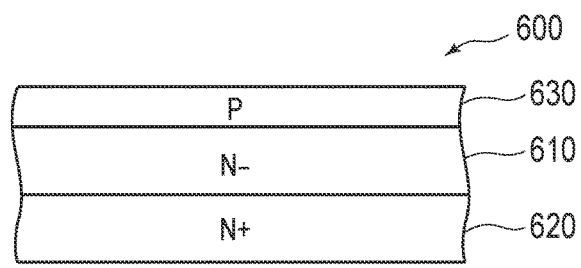
Figure 6C:
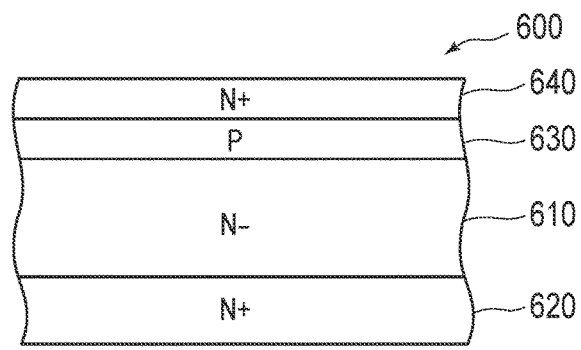

As shown in FIG. 6A, a substrate 600 may be formed by depositing an N-semiconductor layer 610 on an N+ silicon substrate 620. The N- semiconductor layer 610 may be formed by epitaxial growth. As shown in FIG. 6B, a surface layer 630 may be formed by implanting an entire surface of the semiconductor substrate 600 with a P-type impurity, such as boron ions. The implantation may be followed by a heat treatment. The heat treatment may heat the substrate from 1000° C. to 1200° C. As shown in FIG. 6C, a surface layer 640 may be formed on the layer 630 by implanting an entire surface of the semiconductor substrate 600 with an N-type impurity, such as phosphorus ions. The implantation may be followed by a heat treatment. The heat treatment may heat the substrate from 1000° C. to 1200° C.

Figure 7A:
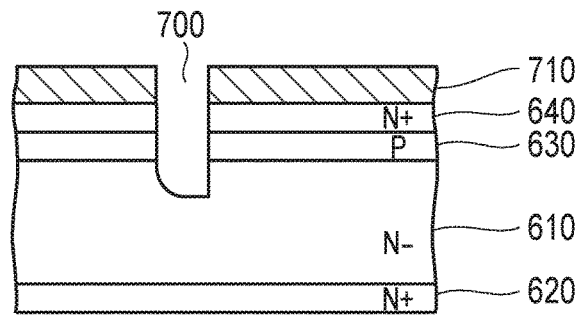
FIG. 7A-FIG. 7G are diagrams illustrating cross-sectional views of a substrate of a power semiconductor device during various stages of trench and gate electrode structure formation according to one or more embodiments.
Figure 7B:
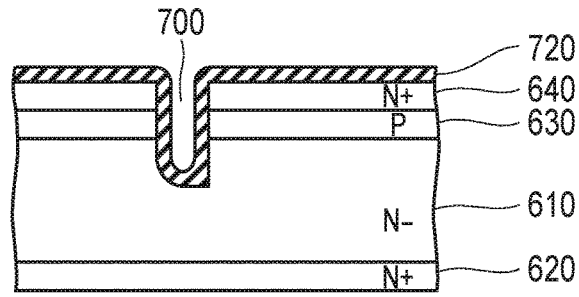
Figure 7C:
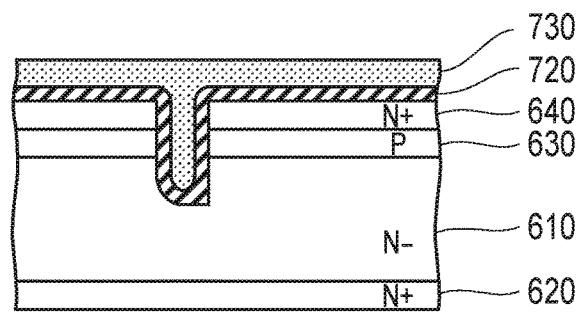
Figure 7D:
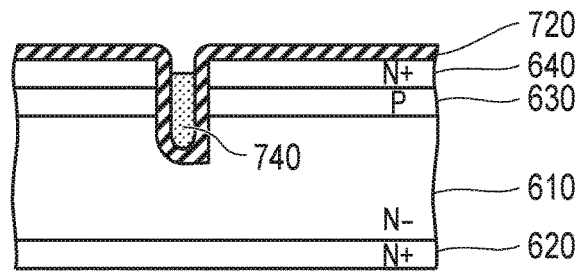
Figure 7E:
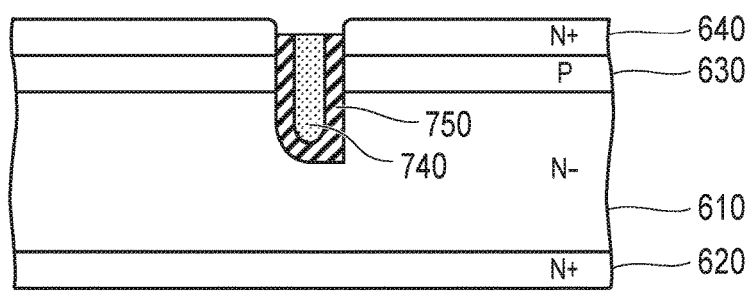
Figure 7F:
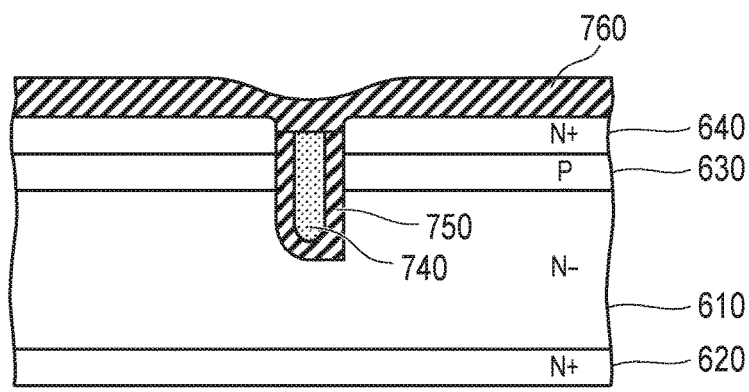
Figure 7G:
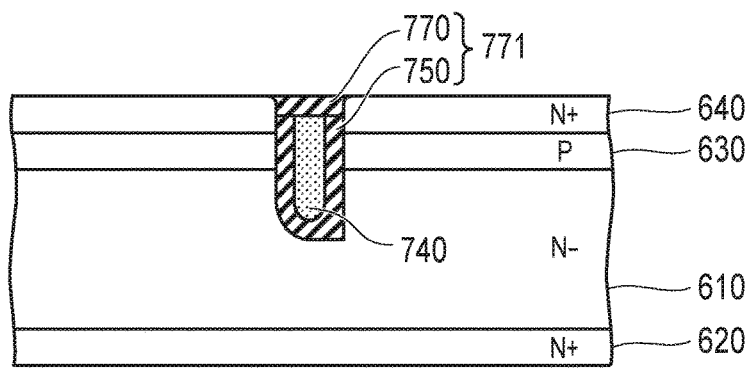

As shown in FIG. 7A, the substrate 600 may be further worked to form a trench 700. The trench 700 may be formed by forming a resist mask 710 with an opening that exposes a location on the surface of the substrate 600 where the trench is to be formed. The trench 700 may be formed by a dry etching process. After the trench 700 is formed by the dry etching process, the resist mask 710 may be removed. As shown in FIG. 7B, after formation of the trench 700 and removal of the resist mask 710, the entire surface of the substrate 600 including the walls of the trench 700 are subjected to a thermal oxidation process to form an oxidation layer 720. As shown in FIG. 7C, a polysilicon layer 730 may be deposited over the oxidation layer 720 on the entire surface of the substrate 600 including filling the trench 700. As shown in FIG. 7D, the polysilicon layer 730 may be etched back to form a gate electrode 740 embedded in the trench 700. As shown in FIG. 7E, the oxidation layer 720 on the layer 640 of the substrate 600 and in the trench 700 may be removed by etching down to a top surface of the newly formed gate electrode 740 such that a remaining portion 750 of the oxidation layer 720 remains surrounding a lower portion of the gate electrode 740 in the trench 700. As shown in FIG. 7F, the entire surface of the substrate 600 may be subjected to another thermal oxidation process to form an oxide film 760, such as silicon dioxide, that covers the top of the gate electrode 740, the remaining portion 750, and the inner trench walls within the top portion of the trench 700. As shown in FIG. 7G, the oxide film 760 may be etched back such that the layer 640 is exposed and the top surface of the gate electrode 740, and the remaining portion 750 is covered with a portion 770 of the etched oxide film 760.

Figure 8A:
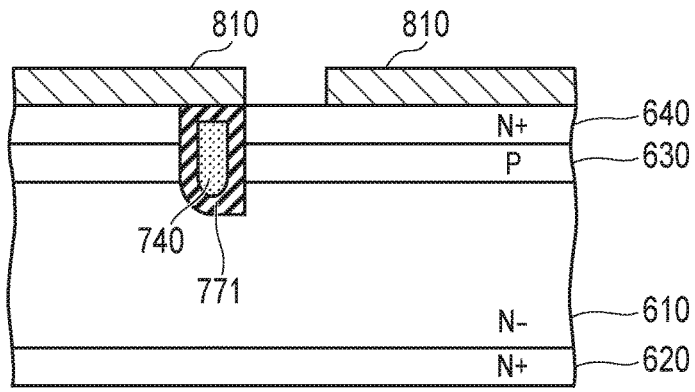
FIG. 8A-FIG. 8J are diagrams further illustrating cross-sectional views of a substrate of a power semiconductor device during various stages of trench and electrode structure formation according to one or more embodiments.
Figure 8B:
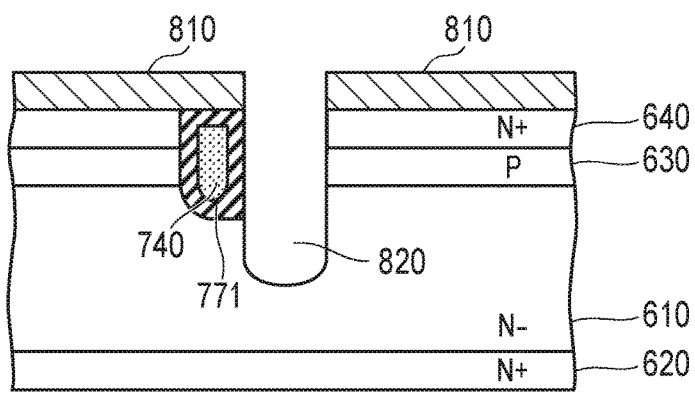
Figure 8C:
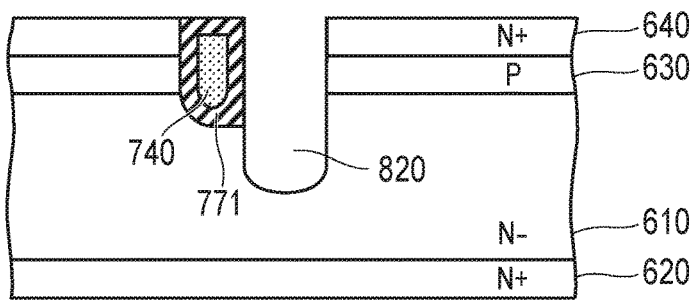
Figure 8D:
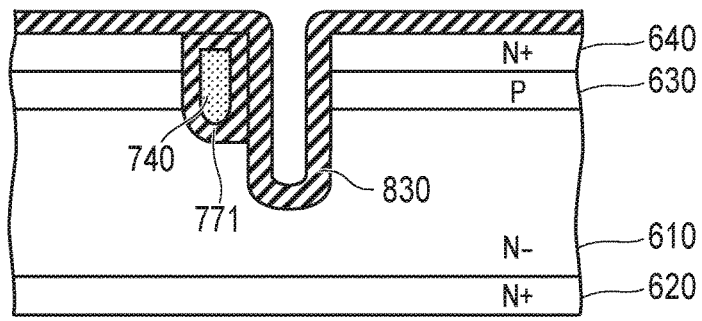
Figure 8E:
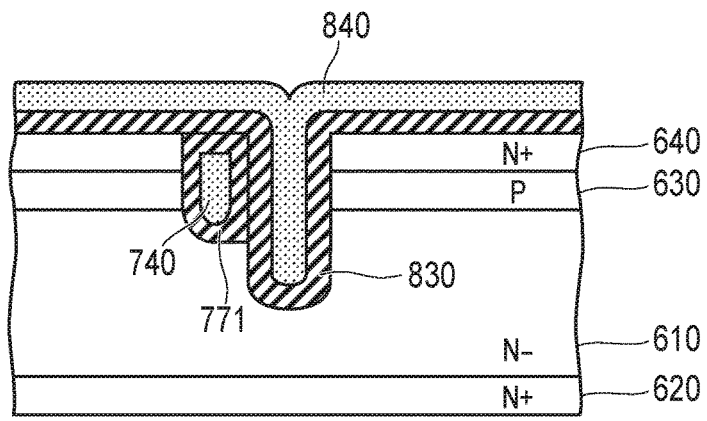
Figure 8F:
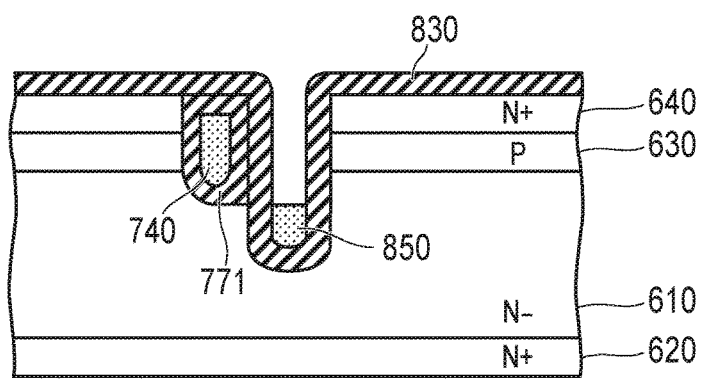
Figure 8G:
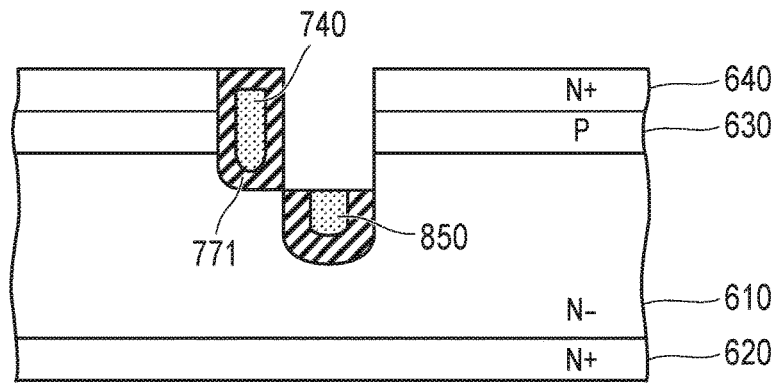
Figure 8H:
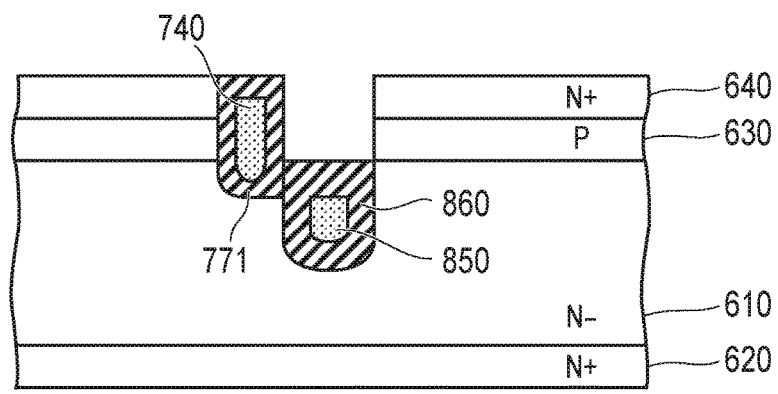
Figure 8I:
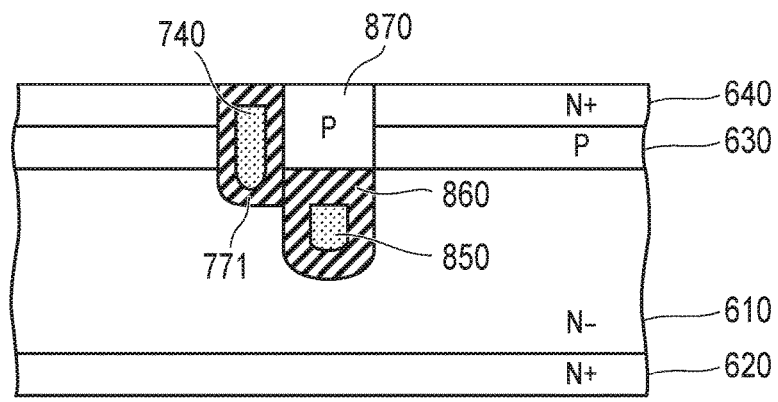
Figure 8J:
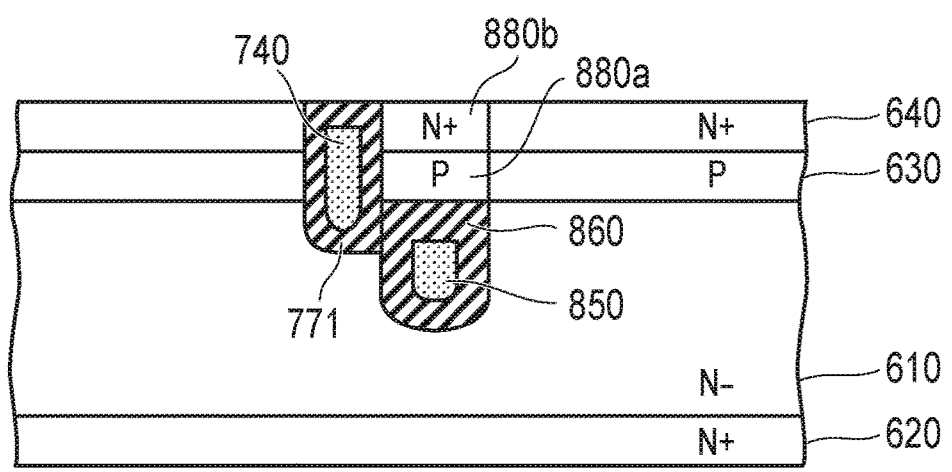

Once the gate electrode 740 is formed and surrounded by an oxide layer including portions 750 and 770 that form gate insulating portions, the portion of the trench 700 for the source electrode may be formed. The gate insulating portions 750 and 770 form an insulating layer around the gate electrode 740 and may be referred to collectively as layer 771 in the figures. As shown in FIG. 8A, the substrate 600 may be further worked to form a trench 820. The trench 820 may be formed by forming a resist mask 810 with an opening that exposes a location on the surface of the substrate 600 adjacent to the newly formed gate electrode 740 and trench 700, where the trench 820 is to be formed. As shown in FIG. 8B, the trench 820 may be formed by a dry etching process. As shown in FIG. 8C, after the trench 820 is formed by the dry etching process, the resist mask 810 may be removed. As shown in FIG. 8D, after formation of the trench 820 and removal of the resist mask 810, the entire surface of the substrate 600 including the walls of the trench 820 are subjected to another thermal oxidation process to form an oxidation layer 830. As shown in FIG. 8E, a polysilicon layer 840 may be deposited over the oxidation layer 830 on the entire surface of the substrate 600 including filling the trench 820. As shown in FIG. 8F, the polysilicon layer 840 may be etched back to form a source electrode 850 embedded in the trench 820. As shown in FIG. 8G, the oxidation layer 830 on the layer 640 of the substrate 600 and in the trench 820 may be removed by etching down to a top surface of the newly formed source electrode 850. As shown in FIG. 8H, the entire surface of the substrate 600 may be subjected to another thermal oxidation process to form an oxide film 860 that covers the top of the source electrode 850 and the inner trench walls within the trench 820. As shown in FIG. 8I, a P-type silicon layer 870 may be formed on top of the oxide film 860 by epitaxial growth. The P-type silicon layer 870 may be processed to form a P-type silicon layer 880a and an N+ layer 880b. The N+ layer 880b may be formed by implanting N type impurities such as phosphorous ions.

In accordance with the above described embodiments, electrical characteristics such as ON resistance may be improved (e.g., lowered in the case on ON resistance).

Although one or more embodiments as described above herein may be directed to devices having a particular arrangement of layers with conductivity types, e.g. N, N+, P, and so on, other embodiments may be directed to devices in which the conductivity types are reversed or otherwise modified. Furthermore, the above-described aspects may be combined with each other as practicable within the contemplated scope of embodiments. The above described embodiments are to be considered in all respects as illustrative, and not restrictive. The illustrated and described embodiments may be extended to encompass other embodiments in addition to those specifically described above without departing from the intended scope of the invention. The scope of the invention is to be determined by the appended claims when read in light of the specification including equivalents, rather than solely by the foregoing description. Thus, all configurations including configurations that fall within equivalent arrangements of the claims are intended to be embraced in the invention.

The invention claimed is:

1. A semiconductor device, comprising:
a substrate;
a trench formed in the substrate and filled with an insulating layer; and
a single gate electrode and a single source electrode embedded in the insulating layer, wherein
the single gate electrode and the single source electrode are positioned in the insulating layer in the trench above and below each other; and
from a cross-sectional perspective, the single gate electrode and the single source electrode are not overlapped in a horizontal and a vertical direction respectively.

2. The semiconductor device according to claim 1, wherein:
the trench extends to a first depth of a bottom surface of the trench below the single gate electrode;
the trench extends to a second depth of the bottom surface of the trench below the single source electrode; and
the first depth and the second depth are different.

3. The semiconductor device according to claim 2, wherein the second depth is deeper than the first depth.

4. The semiconductor device according to claim 2, wherein:
the single source electrode comprises an upper surface that faces a trench opening; and
the upper surface of the single source electrode is positioned deeper in the trench than the first depth of the bottom surface of the trench below the single gate electrode.

5. The semiconductor device according to claim 1, wherein:
a base layer of the substrate adjacent a first sidewall of the trench on a first side of the single gate electrode comprises a first concentration of a first conductivity type;
the base layer of the substrate adjacent a second sidewall of the trench on a second side of the single gate electrode comprises a second concentration of the first conductivity type; and
the first concentration is a higher concentration than the second concentration.

6. The semiconductor device according to claim 5, wherein the first concentration and the second concentration are related by the expression: Ca/Cb>2, wherein Ca is the first concentration, and Cb is the second concentration.

7. The semiconductor device according to claim 6, wherein:
the single source electrode comprises an upper surface that faces a trench opening; and the upper surface of the single source electrode is positioned deeper in the trench than a first depth of a bottom surface of the trench below the single gate electrode.

8. The semiconductor device according to claim 1, wherein:
the trench comprises a first trench and a second trench different from the first trench;
the single gate electrode is formed in the first trench and the single source electrode is formed in the second trench; and
a bottom surface of the second trench below the single source electrode is deeper than a bottom surface of the first trench below the single gate electrode.

9. The semiconductor device according to claim 8, wherein a first material of an insulating layer of the first trench is different from a second material of an insulating layer of second trench.

10. The semiconductor device according to claim 9, wherein the first material comprises $SiO_2$ and the second material comprises $Si_3N_4$.

* * * * *